United States Patent
Axling

(10) Patent No.: US 8,078,562 B2
(45) Date of Patent: Dec. 13, 2011

(54) DECOMPOSING CONFIGURATION PROBLEMS

(75) Inventor: Tomas Axling, Stockholm (SE)

(73) Assignee: Tacton Systems AB, Stockholm (SE)

( * ) Notice: Subject to any disclaimer, the term of this patent is extended or adjusted under 35 U.S.C. 154(b) by 632 days.

(21) Appl. No.: 12/273,954

(22) Filed: Nov. 19, 2008

(65) Prior Publication Data

US 2010/0125607 A1 May 20, 2010

(51) Int. Cl.
*G06N 5/00* (2006.01)
(52) U.S. Cl. .......................... 706/46; 706/45
(58) Field of Classification Search .................... 706/46, 706/45
See application file for complete search history.

(56) References Cited

U.S. PATENT DOCUMENTS

| | | | |
|---|---|---|---|
| 5,515,524 | A | 5/1996 | Lynch et al. |
| 5,874,955 | A | 2/1999 | Rogowitz et al. |
| 6,223,170 | B1 | 4/2001 | Skovgaard |
| 6,336,110 | B1 | 1/2002 | Tamura et al. |
| 2007/0094175 | A1 | 4/2007 | Axling |

OTHER PUBLICATIONS

Freeman-Benson, A Module Mechanism for Constraints in Smalltalk, OOPSLA '89 Conference proceedings on Object-oriented programming systems, languages and applications, vol. 24 Issue 10, Oct. 1989, pp. 389-396.*

* cited by examiner

*Primary Examiner* — Wilbert L Starks
(74) *Attorney, Agent, or Firm* — Alston & Bird LLP

(57) ABSTRACT

An artifact is configured whose constituting components and features are selectable via parameters in an interrelated set of parameters. A range of consistent configurations for the artifact is defined by a set of constraints restricting which variable values that are simultaneously selectable. A proposed storage means stores a problem description in the form of a part-of hierarchy and a list of step definitions. The part-of hierarchy includes at least two different parts and each step definition includes a pointer to a respective part in the part-of hierarchy. A processing means solves constraint satisfaction problems in response to input data designating parameter settings, and an application module creates and executes step instances, which are based on the list of step definitions. The step instances are executed sequentially, and the execution of each step instance involves: creating a CSP based on the part to which the pointer of the corresponding step definition points and any descendents to this part, presenting a range of variables wherein each variable has at least one selectable value assignable via a user-committed setting in the input data, solving the CSP of the step instance based on the user-committed settings and any variable values resulting from any preceding step instances in said sequence, and presenting the set of resulting variable values. The application module repeatedly prompts a user to enter input data to represent user-committed settings until all the step instances in said sequence have been executed.

25 Claims, 3 Drawing Sheets

DECOMPOSING CONFIGURATION PROBLEMS

THE BACKGROUND OF THE INVENTION AND PRIOR ART

The present invention relates generally to interactive computer-implemented support solutions for facilitating the configuration of complex products having characteristics that are variable over a relatively wide range of possibilities. More particularly the invention relates to a system for configuring an artifact according to claim 1 and a method according to claim 10. The invention also relates to a computer program product according to claim 18 and a computer readable medium according to claim 19.

When a customer orders or purchases a product, or a system of products, hereinafter collectively referred to as an artifact (e.g. a car, a truck or a computer), which has a plurality of selectable features, sub-components etc., it may be a very intricate and tedious task to find a combination of features that is both technically permissible and satisfies the customer's requirements (as well as applicable regulatory restrictions, such emission levels, maximum vehicle dimensions and axle weights). Moreover, the combinations of possible choices are often interrelated, such that for instance a particular gearbox can only be used together with certain engine types and so on. Of course, depending on choices made at one stage, other choices to be made at a later stage may become irrelevant. For example, when configuring a computer a user may choose not to include a CD-ROM station in his/her PC, and instead opt for a DVD read/write station. If so, the user would like to avoid having to specify a particular CD-ROM model in a later step of the configuration procedure.

U.S. Pat. No. 5,515,524 describes a method and an apparatus for configuring systems, which employs a generative approach. Here, a configuration system with a model hierarchy is used, which is referred to as being a constraint-based. This approach renders it possible to define a model element as being contained in, or by, another model element. Consequently, logical and physical interconnections between various elements can be identified. However, the configuration engine operates in batch mode, i.e. it can only be applied to a complete set of parameters. This means that the mechanisms for selecting the parameters and the logic associated therewith are separated from the configuration model. As a result, only relatively low degrees of efficiency and user-friendliness are attainable.

U.S. Pat. No. 5,874,955 discloses an interactive rule-based system with selection feedback that parameterizes rules to constrain choices for multiple operations. This system may reduce the number of necessary choices. However, since at each stage, also options potentially incompatible with the configuration according to the prior choices are presented to the user; a latest made parameter selection can result in a rejection. Typically, this behavior will irritate the user who then must step back a number of steps, and choose differently.

U.S. Pat. No. 6,336,110 describes a system for solving a constraint satisfaction problem (CSP) and constructing of a system, wherein a large CSP is divided into a plurality of subsets, which each only has two alternatives for each part. Allegedly, this division renders it possible to solve the large CSP relatively quickly. However, in practice, configuration problems often contain variables with very large domains, e.g. variables expressing dimensions like length, width and/or height. Therefore, this division-approach is not efficient. Namely, the number of subsets here becomes unrealistically large.

U.S. Pat. No. 6,223,170 reveals a solution for inference of partial knowledge in interactive configuration, which enables configuration of a set of object values in a computer, e.g. in order to configure a car by choosing a specific combination of engine, paint, accessories, etc. The object values are here constrained by a rule base defining a number of relationships between the objects or the object values. Knowledge about undetermined object values is deduced by means of at least one interruptible algorithm. Thus, it can be determined whether a user selection of some, or all of, the individual undetermined object values are possible or not. Nevertheless, the strategy proposed in this document is tightly linked to the configuration of a particular product having predetermined object values and constraints. In order to be applicable to the configuration of a different product the apparatus and the method performed thereby must be redesigned entirely. Naturally, this is highly inflexible.

Applicant's published U.S. Patent Application No. 2007/0094175 discloses interactive computer-implemented support solutions for facilitating the configuration of complex artifacts. Here, a model translation module converts a configuration model into a CSP. The CSP, in turn, is defined by a set of variables, wherein each variable may attain a finite number of different values, and a set of constraints restricting which variable values that are simultaneously possible for the variables in the set of variables. A configuration engine calculates a solution to the CSP, which solution is optimal with respect to a value assigned to each variable in the CSP relative to a predefined optimizing criterion. The configuration engine also derives a set of optimal parameter values associated with the calculated solution. Hence, these parameter values describe the artifact's configuration.

Although this strategy is generally highly efficient, in practice the approach may be incapable of handling the configuration of very complex artifacts. Namely, the number of variables must be known on beforehand, and a large CSP may require exponential time to solve.

SUMMARY OF THE INVENTION

The object of the present invention is therefore to provide a flexible artifact configuration solution, which alleviates the above problems and thus offers an efficient and user-friendly tool suitable also for highly complex artifacts.

According to one aspect of the invention, the object is achieved by a system for configuring an artifact whose constituting components and features are selectable via parameters in an interrelated set of parameters. A range of consistent configurations for the artifact is here defined by a set of constraints restricting which variable values that are simultaneously selectable. The system includes a storage means, a processing means and an application module. The storage means is arranged to store a problem description in the form of a part-of hierarchy and a list of step definitions. The part-of hierarchy includes at least two different parts and each step definition includes a pointer to a respective part in the part-of hierarchy. The processing means is arranged to solve constraint satisfaction problems in response to input data designating parameter settings. The application module is arranged to create and execute step instances, which are based on the list of step definitions. The step instances are executed sequentially, and the execution of each step instance involves the following procedure. First, a CSP is created based on the part to which the pointer of the corresponding step definition points as well as any descendents to this part. Second, a range of variables is presented, wherein each variable has at least one selectable value assignable via a user-committed setting in the input data. Third, the processing means is ordered to solve the CSP of the step instance based on the user-committed settings and any variable values resulting from any preceding step instances in the sequence. A set of resulting variable values is received from the processing means, and the set of resulting variable values are presented. The application module is arranged to repeatedly prompt a user to enter input data to represent user-committed settings until all the step instances in the sequence have been executed.

One important advantage of this system is that the decomposing of the configuration problem into smaller sub-problems permits each sub-problem to include an adjustable number of variables in a manner perceived natural to a typical user. Moreover, very large problems can thereby be solved, and the requirement that the number of variables must be known on beforehand can be relaxed.

According to one preferred embodiment of this aspect of the invention, the application module is arranged to create the CSP of a given step instance based on at least one part in the part-of hierarchy. Furthermore, for each part, the interrelated set of parameters defines a first number of instances and a set of descendants thereto. The first number of instances ranges from zero and up, and the set of descendants ranges from empty to a predefined maximum for the part in question. This structure is advantageous because it enables an intuitive user interface.

According to another preferred embodiment of this aspect of the invention, the part-of hierarchy is organized as a number of nodes. Each node is associated with at least one selectable part, and the nodes are organized as ascending parts and descending parts, such that each ascending part is positioned at a higher hierarchal level than any descending parts associated with the ascending part. Namely, such a model is well adapted to the proposed CSP-based approach.

According to yet another preferred embodiment of this aspect of the invention, the application module is arranged to cause presentation of a selectable range of alternatives for at least one part in the part-of hierarchy. The selectable range of alternatives is here defined by a class that specifies a group of components. The application module is also arranged to receive input data in the form of a type variable designating a selected component. Here, each component in the class is associated with a constraint tying the type variable to at least one feature of the artifact. This set-up is desirable, since it further enhances the user interface and an intuitive interaction with the system.

According to still another preferred embodiment of this aspect of the invention, the system includes an input interface arranged to receive the input data in respect of each step instance in the sequence of step instances. The input interface is also arranged to receive a user-generated proceed command arranged to cause the application module to proceed to a subsequent step instance in the sequence of step instances. Hence, a user may conveniently interact with the system. For instance, he/she can assign variable values tentatively, and choose to proceed to next step instance when acceptable resulting values have been attained.

According to a further preferred embodiment of this aspect of the invention, the system includes an output interface arranged to receive at least one resulting variable value from each step instance in the sequence of step instances, where the least one resulting variable value is a calculation result delivered by the application module. Additionally, the output interface is arranged to present the calculation result on a user-comprehensible format. Further preferably, for all step instances except the first, the application module is arranged to receive a user-generated backing command designating returning to a step instance preceding a currently executed step instance in the sequence of step instances. In response to a received backing command, the application module is arranged to (i) store the variable values produced in the currently executed step instance, and (ii) cause presentation of the range of variables whose values are selectable in the pre-ceding step instance. The application module is further arranged to (iii) order the processing means to solve the CSP of the preceding step instance based on variables values set in response to user-generated input data in the pre-ceding step instance as well as on any variable values determined in one or more step instances preceding the preceding step instance. Moreover, the application module is arranged to (iv) receive a set of resulting variable values from the processing means, and (v) cause presentation of the set of resulting variable values. Thereby, the user may also effortlessly go back and forth between the various step instances, assign different variable values, and see how these values influence the result. Naturally, this is a highly desirable feature.

According to yet another preferred embodiment of this aspect of the invention, after presentation of the set of resulting variable values and in response to the user-generated proceed command, the processing means is arranged to solve the CSP of this step instance such that a largest possible number of the stored variable values are restored. Thus, the user's previously indicated preferences are satisfied to a largest possible extent.

According to still another preferred embodiment of this aspect of the invention, the processing means is arranged to implement the application module. Hence, both these functions are embodied in a single unit. Typically, this is advantageous from an efficiency point-of-view.

According to another aspect of the invention, the object is achieved by a method of configuring an artifact whose constituting components and features are selectable via parameters in an interrelated set of parameters. A range of consistent configurations for the artifact is defined by a set of constraints restricting which variable values that are simultaneously selectable. The method involves storing a problem description in the form of a part-of hierarchy, and storing a list of step definitions. The part-of hierarchy includes at least two different parts, and each step definition includes a pointer to a respective part in the part-of hierarchy. The method further involves creating step instances sequentially based on the list of step definitions, and executing the step instances. The execution of each step instance involves: creating a CSP based on the part to which the pointer of the corresponding step definition points as well as any descendents to this part; presenting a range of variables wherein each variable has at least one selectable value assignable via the parameter settings in the input data; and in response to selected variable values solving the CSP of the step instance based on the selected variable values and any variable values resulting from any preceding step instances of said sequence, and presenting the set of resulting variable values. A user is repeatedly prompted to enter input data until all the step instances in said sequence of step instances have been executed.

The advantages of this method, as well as the preferred embodiments thereof, are apparent from the discussion hereinabove with reference to the proposed system.

According to a further aspect of the invention, the object is achieved by a computer program product, which is directly loadable into the internal memory of a computer, and includes software for controlling the above proposed method when said program is run on a computer.

According to another aspect of the invention, the object is achieved by a computer readable medium, having a program recorded thereon, where the program is to control a computer to perform the above-proposed method.

The invention provides an interactive solution capable of providing aid when configuring highly complex products and systems, such as vehicles and computers. In fact, the invention offers a convenient tool for solving a configuration problem of arbitrary complexity. Moreover, the model that defines the configuration problem itself may be interchanged or modified in an expedient manner.

Further advantages, advantageous features and applications of the present invention will be apparent from the following description and the dependent claims.

BRIEF DESCRIPTION OF THE DRAWINGS

The present invention is now to be explained more closely by means of preferred embodiments, which are disclosed as examples, and with reference to the attached drawings.

DESCRIPTION OF PREFERRED EMBODIMENTS OF THE INVENTION

Figure 1:
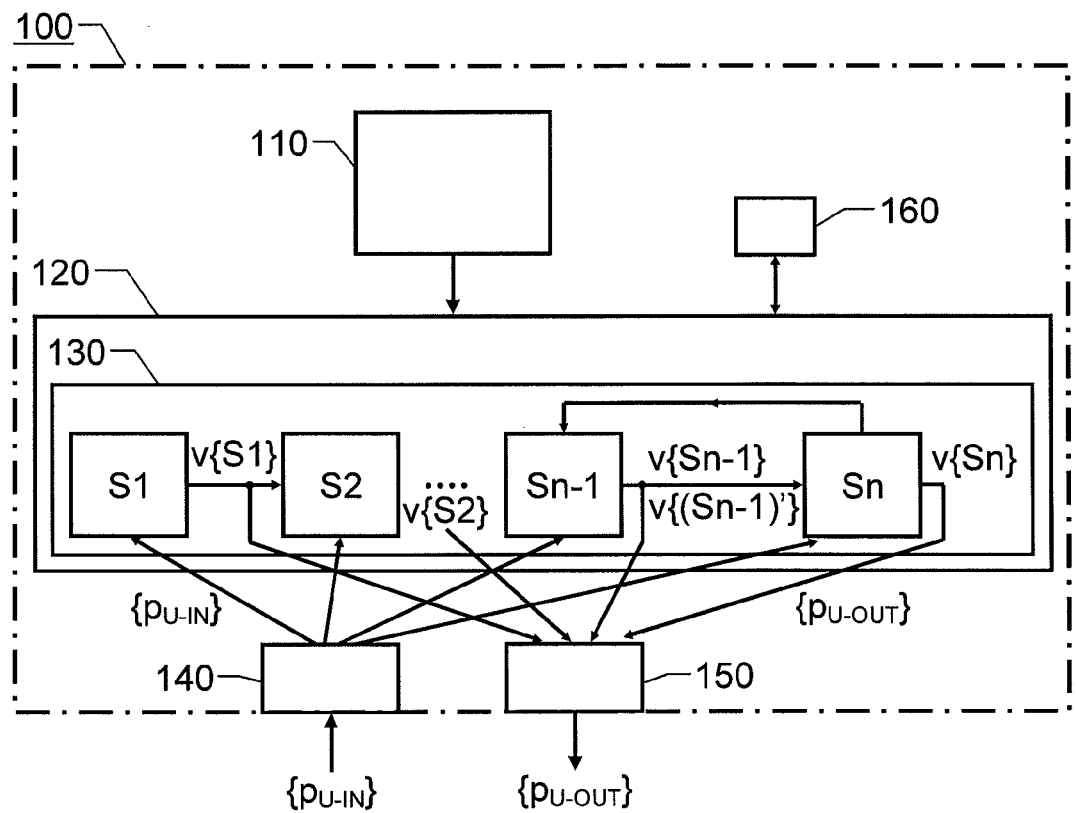
FIG. 1 shows a block diagram over a system according to one embodiment of the invention.

We refer initially to FIG. 1, which shows a block diagram over a system 100 according to one embodiment of the invention. The system 100 is arranged to configure an artifact having variable features. Moreover, we presume that the artifact's constituting components and features are selectable via parameters in an interrelated set of parameters, and that a range of consistent configurations for the artifact is defined by a set of constraints restricting which variable values that are simultaneously selectable.

The system includes a storage means 110, a processing means 120 and an application module 130. It is further preferable if the system 100 includes, or is associated with, one or more of an input interface 140, an output interface 150 and a computer readable medium 160 containing a program, which is adapted to control the operation of the system. Furthermore, it is generally preferable if the processing means 120 is arranged to implement the application module 130. For instance, the application module 130 may be represented by software running on the processing means 120.

The storage means 110 is arranged to store a problem description in the form of a part-of hierarchy and a list of step definitions $S1, S2, \ldots, Sn-1$ and $Sn$. The part-of hierarchy, in turn, includes at least two different parts and each step definition $S1, S2$ up to $Sn-1$ includes a pointer to a respective part in the part-of hierarchy.

The processing means 120 is arranged to solve constraint satisfaction problems (CSPs) in response to input data $\{p_{U\text{-}IN}\}$ designating parameter settings.

The application module 130 is arranged to create and execute step instances, which are based on the list of step definitions $S1, S2, Sn-1$ and $Sn$. The step instances are ordered in a sequence and the execution of each step instance involves the following.

First, the application module 130 creates a CSP based on the part to which the pointer of the corresponding step definition points as well as any descendents to this part. This procedure will be elaborated upon when describing FIG. 2 below. The CSP is defined by a set of variables, wherein each variable may attain a finite number of different values, and a set of constraints restricting which variable values that are simultaneously possible for the variables in the set of variables. A configuration engine calculates a solution to the CSP, which solution is optimal with respect to a value assigned to each variable in the CSP relative to a predefined optimizing criterion. The configuration engine also derives a set of optimal parameter values associated with the calculated solution. Hence, these parameter values describe the artifact's configuration.

In FIG. 1, a first step instance S1 represents a first CSP; a second step instance S2 represents a second CSP, and so on. After having created a given CSP, the application module 130 causes a range of variables of the CSP to be presented, e.g. on a graphical display. Preferably, the presentation has a format that is easily comprehensible by a user. Each variable here has at least one selectable value that is assignable via a user-committed setting in the input data $\{p_{U\text{-}IN}\}$. Thus, a user may assign a variable value by entering input data $\{p_{U\text{-}IN}\}$, for instance via an input interface 140, such as a keyboard. Thereafter (i.e. after receiving the input data $\{p_{U\text{-}IN}\}$), the application module 130 orders the processing means 120 to solve the CSP of the step instance. Hence, the CSP is solved based on the user-committed settings. However, the CSP is likewise solved based on any variable values $v\{S1\}, v\{S2\}, v\{Sn-1\}$, which result from one or more preceding step instances $S1, S2, \ldots, Sn$ or $Sn-1$ in the sequence of step instances.

When the CSP has been solved, the application module 130 receives a corresponding set of resulting variable values from the processing means 120. In the first step instance S1 a first set of resulting variable values $v\{S1\}$ is received, in the second step instance S2 a second set of resulting variable values $v\{S2\}$ is received, and so on. Finally, the application module 130 causes the set of resulting variable values $v\{S1\}, v\{S2\}, v\{Sn-1\}$ or $v\{Sn\}$ respectively to be presented on a user-comprehensible format.

To ensure that the artifact is configured completely, the application module 130 is arranged to repeatedly prompt the user to enter input data $\{p_{U\text{-}IN}\}$ specifying user-committed settings until all the step instances $S1, S2, \ldots, Sn-1$ and $Sn$ in the sequence of step instances have been executed.

Figure 2:
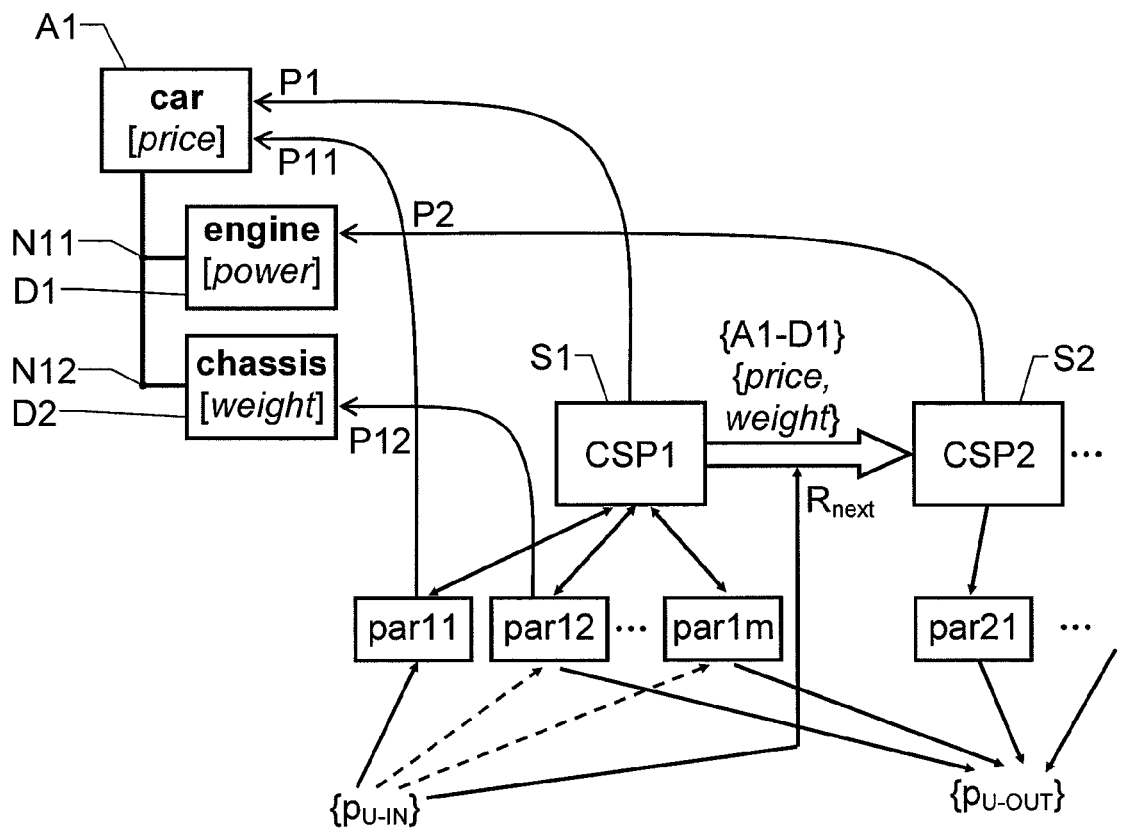
FIG. 2 illustrates the principles of the proposed procedure with reference to a configuration example.

We now refer to FIG. 2, which further illustrates the principles of the proposed procedure. Here, we assume that the artifact to be configured is a car/automobile. Hence, the total price, the engine power and the chassis weight are typically included in an interrelated set of parameters interesting to optimize. In FIG. 2, a top-most part A1 concerns the total price of the car.

According to one preferred embodiment of the invention, the application module 130 creates the CSP of a given step instance, say CSP1 of S1, based on at least one part in the part-of hierarchy (i.e. the problem description of the configuration). In the first step definition S1, which includes a pointer to the top-most part A1, the interrelated set of parameters are exemplified by $par11, par12, \ldots, par1m$. For each part in the part-of hierarchy, the parameters define a first number of instances, and a set of descendants thereto. The first number of instances ranges from zero and up, and the set of descendants ranges from empty up to a predefined maximum for the part in question.

The part-of hierarchy is organized as a number of nodes. The example in FIG. 2 shows two such nodes, N11 and N12. Each node is associated with at least one selectable part. Here, a first node N11 concerning the engine power is associated with top-most part A1 and a first descending part D1, and a second node N12 is associated with a second descending part D2 concerning the chassis weight. As can be seen, the parts A1, D1 and D2 have an ascending/descending interrelationship. More precisely, the top-most part A1 is an ascending part relative to all other parts, here D1 and D2; D1 is a descending part relative to A1 and an ascending part relative to D2; and D2 is a descending part relative to A1 and D1. In other words, each ascending part A1 and D1 is positioned at a higher hierarchal level than any descending parts D1, D2 and D2 respectively associated with the ascending part.

We now return briefly to FIG. 1. To enable convenient user interaction, the application module 130 is preferably arranged to cause presentation of a selectable range of alternatives for at least one part in the part-of hierarchy. Referring to the example illustrated in FIG. 2, the total price of the car may be one such range, which is selectable via a first parameter par11 in the input data $\{p_{U\text{-}IN}\}$. The application module 130 is preferably arranged to receive the input data $\{p_{U\text{-}IN}\}$ in the form of a type variable designating a selected component, for example expressing a desired total price, and thus representing the first parameter par11. The first parameter par11 therefore has a pointer P11 to the top-most part A1. As mentioned above, the first parameter par11 is also included in the interrelated set of parameters of the first step instance S1 this case, the first parameter par11 simply expresses a monetary amount. However, generally, the selectable range of alternatives is defined by a class that specifies a group of components. Moreover, each component in the class is associated with a constraint tying the type variable to at least one feature of the artifact. Naturally, the price is tied to all the features of the car in one way or the other.

In order to further enhance the user interaction with the system 100, an input interface 140 is preferably included, which is arranged to receive the input data $\{p_{U\text{-}IN}\}$ in respect of each step instance in the sequence of step instances. Hence, the first step instance S1 receives input data $\{p_{U\text{-}IN}\}$ expressing the parameters par11 through par1$m$, the second step instance S2 receives input data $\{p_{U\text{-}IN}\}$ expressing a different set of parameters (not shown), and so on.

Furthermore, in each step instance S1, S2 etc., the input interface 140 is arranged to receive a user-generated proceed command $R_{next}$. This command causes the application module 130 to proceed to a subsequent step instance in sequence of step instances, i.e. for example from the first step instance S1 to the second step instance S2. Consequently, the user generates proceed command $R_{next}$ whenever he/she is satisfied with the variable values resulting from the present step instance. The resulting variable values represent a calculation result $\{p_{U\text{-}OUT}\}$ from the processing means 120. When proceeding from one step instance, say S1, to another step instance, say S2, variable values are also forwarded between corresponding CSPs, i.e. here from CSP1 to CSP2. FIG. 2 exemplifies these values by variables price and weight.

According to one preferred embodiment of the invention, the system 100 includes an output interface 150, which is arranged to receive at least one resulting variable value $v\{S1\}$, $v\{S2\}$, ..., $v\{Sn-1\}$ and $v\{Sn\}$ (i.e. the calculation result $\{p_{U\text{-}OUT}\}$) from each step instance S1, S2, ..., Sn-1 and Sn in the sequence of step instances. The output interface 150 is arranged to present the calculation result $\{p_{U\text{-}OUT}\}$ on a user-comprehensible format (e.g. on a graphical display). Thereby, the user may gradually step through the sequence of step instances, whereby in each step instance he/she assigns variable values, checks the result and finally obtains a desired configuration of the artifact.

Oftentimes, when a user executes a step instance in the sequence, he/she realizes that it might have been better to select the variable values differently in one or more previous step instances. Therefore, to provide additional flexibility, it is desirable to also allow a straightforward back-stepping through the proposed sequence of step instances. To this aim, for all step instances except the first step instance S1, the application module 130 is preferably arranged to receive a user-generated backing command. Referring again to FIG. 1, the backing command designates returning to a step instance Sn−1 preceding a currently executed step instance Sn in the sequence of step instances.

In response to a received backing command, the application module 130 is arranged to: (i) store variable values $v\{Sn\}$ produced in the currently executed step instance Sn; (ii) cause presentation of the range of variables whose values are selectable in the preceding step instance Sn−1; and (iii) order the processing means 120 to solve the CSP of the preceding step instance Sn−1. Specifically, this CSP is solved based on variables values set in response to user-generated input data $\{p_{U\text{-}IN}\}$ as well as any variable values determined in one or more step instances, such as S1 and S2, preceding the preceding step instance Sn−1. The processing means 120 solves the CSP and thus produces a new set of resulting variable values $v\{S(n-1)'\}$. The application module 130 then receives the set of resulting variable values $v\{S(n-1)'\}$ and causes presentation of the set of resulting variable values $v\{S(n-1)'\}$ on a user-comprehensible format.

After presentation of the set of resulting variable values $v\{S(n-1)'\}$ and in response to the user-generated proceed command $R_{next}$, the processing means 120 is arranged to solve the CSP of the subsequent step instance, i.e. here Sn, such that a largest possible number of the stored variable values $v\{Sn\}$ are restored. Namely, thereby it is expected that the user's previously indicated preferences are satisfied to a largest possible extent.

For example, the restoration may be effected as follows. As mentioned earlier, when receiving the backing command, the variable values $v\{Sn\}$ are stored with their path values. Moreover, for each path value pair a variable $X_i$ in the CSP of the step instance corresponding to the path is entered as an additional constraint:

$$X_i = V_i \leftrightarrow M_i = 1,$$

where $V_i$ is the value and $M_i$ is a Boolean variable (0 or 1). Then, a sum $\Sigma M_i$ of all $M_i$ is the number of kept previous values.

The present embodiment of the invention involves finding a solution to the CSP of the step instance with the highest possible value for the sum $\Sigma M_i$. The parameters associated with $X_i$ for which $M_i=1$ in said solution is set to $V_i$ (i.e. the previous variable value $v\{Sn\}$ of the step instance Sn).

Figure 3:
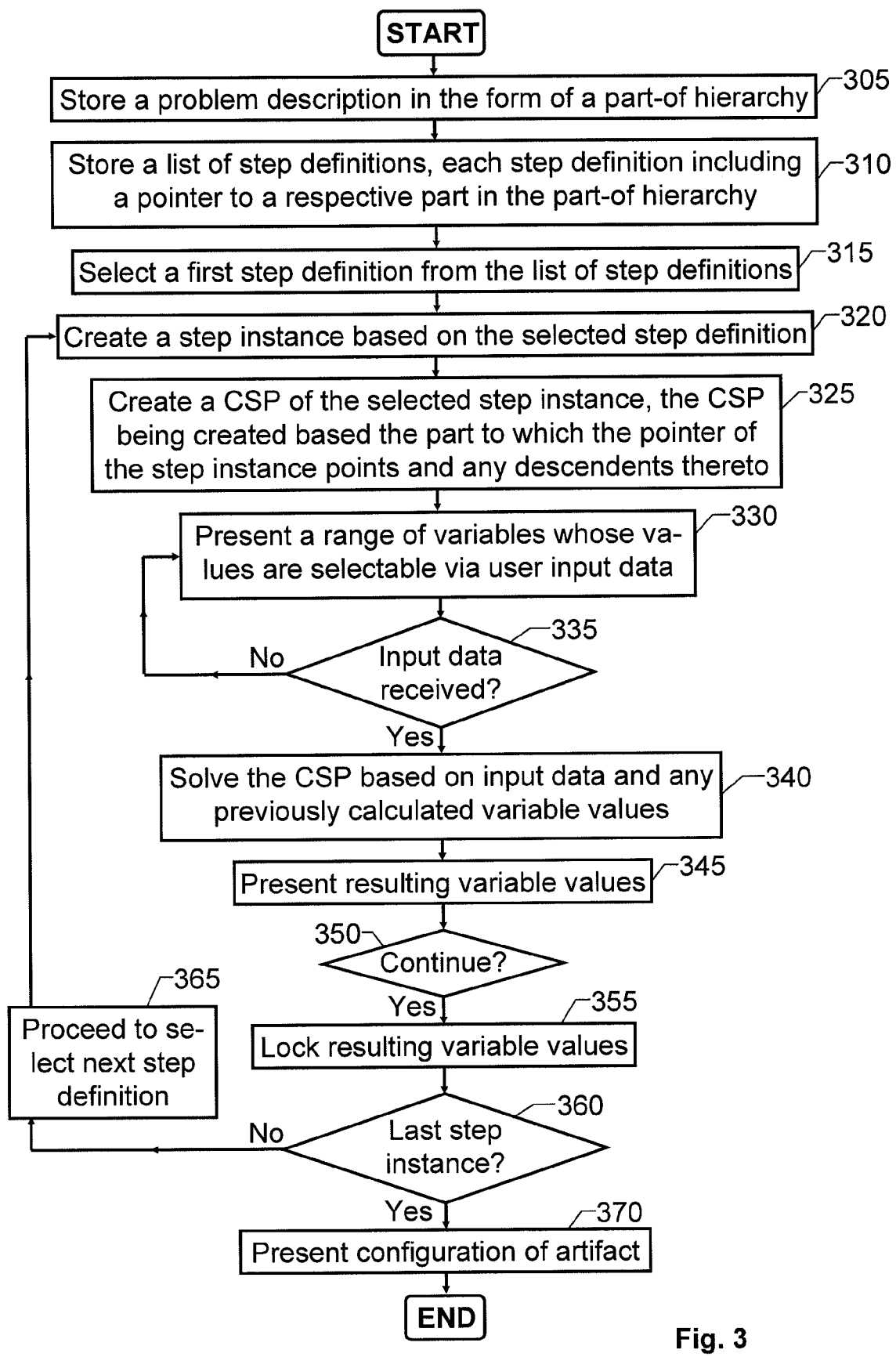
FIG. 3 illustrates, by means of a flow diagram, a general method of controlling a computer apparatus according to the invention.

To sum up, the general method of controlling a computer apparatus according to the invention in order to configure an artifact will now be described with reference to the flow diagram in FIG. 3.

An initial procedure step 305 stores a problem description concerning the configuration in the form of a part-of hierarchy. Then, a procedure step 310 stores a list of step definitions, where each step definition includes a pointer to a respective part in the part-of hierarchy. It is here presumed that the part-of hierarchy includes at least two different parts. Thereafter, a procedure step 315 selects a first step definition from the list of step definitions. Subsequently, a procedure step 320 creates a step instance based on the selected step. I.e. a first step instance S1 is based on the step definition selected in procedure step 315. Any following step instances are executed sequentially after the first step instance S1.

The execution of step instances involves procedure steps 325 through 355. Procedure step 325 creates a CSP based on the part (as well as any descendents to this part) to which the pointer of the step definition corresponding to the step instance to be executed points. A following procedure step 330 presents a range of variables whose values are assignable via the parameter settings in user-generated input data. Then a procedure step 335 checks whether or not such input data has been received, and if not the procedure loops back and stays in step 335. Otherwise (i.e. if adequate input data is received), a step 340 follows in which the CSP of the step is solved based on the selected variable values. For all steps except the first step, the CSP may also be solved based on one or more variable values resulting from at least one preceding step in the sequence of steps. Thereafter, a procedure step 345 presents a set of resulting variable values (i.e. values calculated when solving the CSP in procedure step 340), and a step 350 inquires whether or not the user wishes to proceed with the configuration based on these variable values. If so, a procedure step 355 follows, and otherwise the procedure loops back to procedure step 330, where a set of manipulable variables and associated ranges is again presented.

Procedure step 355 locks the set of resulting variable values, and a procedure step 360 follows. This procedure step checks whether or not the latest executed step was the last step in the sequence of steps, and if so a step 370 follows. Otherwise, the procedure continues to a procedure step 365, which causes execution of the next step instance. More precisely, step 365 selects the next step definition in the sequence of step definitions (i.e. S2 is selected if S1 has just been executed). Thereafter, procedure step 320 follows.

Procedure step 370 finally presents a configuration of the artifact in accordance with the variable values assigned through the execution of the step instances as described above.

Figure 4:
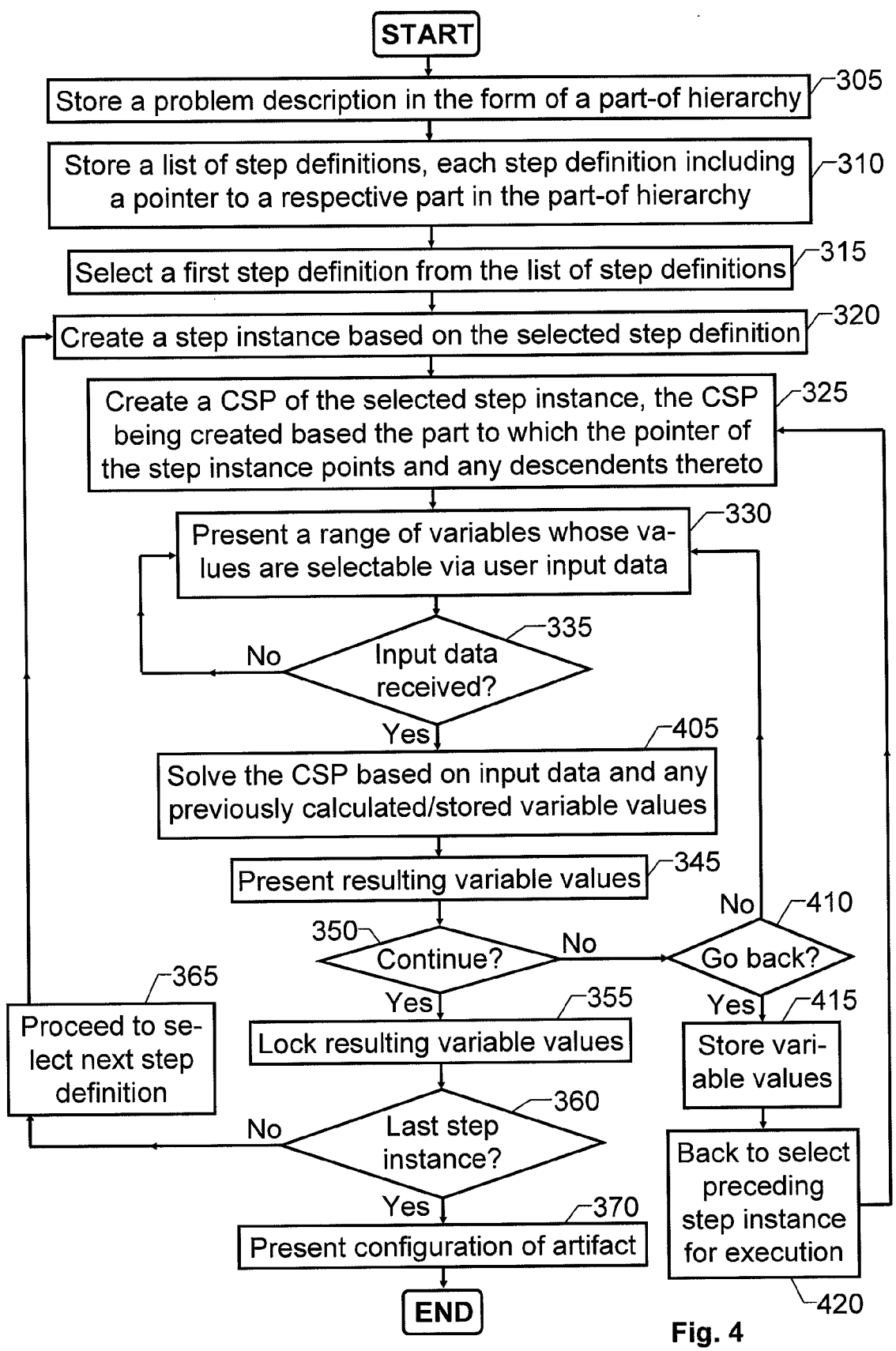
FIG. 4 illustrates, by means of a flow diagram, a preferred embodiment of the proposed method.

FIG. 4 shows a flow diagram, which illustrates a preferred embodiment of the proposed method, wherein the user is offered a possibility to go back in the sequence of steps. Here, all procedure steps 305 through 370 that are also included in the flow diagram of FIG. 3 are identical to the procedure steps 305-370 described above with reference to FIG. 3. Nevertheless, the flow diagram of FIG. 4 also contains additional procedure steps 405, 410, 415 and 420.

Procedure step 405 follows after procedure step 335 if adequate user input data is received. Procedure step 405 replaces the above-described procedure step 340, and involves solving the CSP of the step based on the selected variable values. Analogous to procedure step 340, for all steps except the first step, the CSP may also be solved based on one or more variable values resulting from at least one preceding steps in the sequence of steps. However, in addition to that, the CSP may also be solved based on stored variable values that have been calculated in one or more subsequent steps in the sequence of steps.

Procedure step 410 follows after procedure step 350 in response to a user command indicating that the procedure should not continue to the next step in the sequence of steps. Procedure step 410 inquires whether or not the user wishes to go back. If not (i.e. if the user instead wishes to modify the variable values of the present step), procedure step 330 follows. Otherwise (i.e. the user does wish to go back), procedure step 415 follows. This procedure step stores the variable values calculated in procedure step 405. Then, procedure step 420 follows, which takes the procedure back to the preceding step instance, i.e. such that this step is selected for execution in procedure step 325.

All of the procedure steps, as well as any sub-sequence of procedure steps, described with reference to FIGS. 3 and 4 above may be controlled by means of a programmed computer apparatus. Moreover, although the embodiments of the invention described above with reference to the drawings comprise computer apparatus and processes performed in computer apparatus, the invention thus also extends to computer programs, particularly computer programs on or in a carrier, adapted for putting the invention into practice. The program may be in the form of source code, object code, a code intermediate source and object code such as in partially compiled form, or in any other form suitable for use in the implementation of the process according to the invention. The program may either be a part of an operating system, or be a separate application. The carrier may be any entity or device capable of carrying the program. For example, the carrier may comprise a storage medium, such as a Flash memory, a ROM (Read Only Memory), for example a CD (Compact Disc) or a semiconductor ROM, an EPROM (Erasable Programmable Read-Only Memory), an EEPROM (Electrically Erasable Programmable Read-Only Memory), or a magnetic recording medium, for example a floppy disc or hard disc. Further, the carrier may be a transmissible carrier such as an electrical or optical signal which may be conveyed via electrical or optical cable or by radio or by other means. When the program is embodied in a signal which may be conveyed directly by a cable or other device or means, the carrier may be constituted by such cable or device or means. Alternatively, the carrier may be an integrated circuit in which the program is embedded, the integrated circuit being adapted for performing, or for use in the performance of, the relevant processes.

The term "comprises/comprising" when used in this specification is taken to specify the presence of stated features, integers, steps or components. However, the term does not preclude the presence or addition of one or more additional features, integers, steps or components or groups thereof.

The invention is not restricted to the described embodiments in the figures, but may be varied freely within the scope of the claims.

The invention claimed is:

1. A system for configuring an artifact whose constituting components and features are selectable via parameters in an interrelated set of parameters, a range of consistent configurations for the artifact being defined by a set of constraints restricting which variable values that are simultaneously selectable, the system comprising:
    a storage means arranged to store:
        a problem description in the form of a part-of hierarchy, and
        a list of step definitions,
    the part-of hierarchy including at least two different parts and each step definition including a pointer to a respective part in the part-of hierarchy,
        a processing means arranged to solve constraint satisfaction problems in response to input data designating parameter settings, and
        an application module arranged to create and execute step instances which are based on the list of step definitions, the step instances being executed sequentially and the execution of each step instance involving:

creating a constraint satisfaction problem based on the part to which a pointer a corresponding step definition points and any descendents to this part, causing presentation of a range of variables wherein each variable has at least one selectable value assignable via a user-committed setting in the input data, ordering the processing means to solve the constraint satisfaction problem of the step instance based on the user-committed settings and any variable values resulting from any preceding step instances in said sequence, receiving from the processing means a set of resulting variable values, and causing presentation of the set of resulting variable values, the application module being arranged to repeatedly prompt a user to enter input data to represent user-committed settings until all the step instances in said sequence have been executed.

2. The system according to claim 1, wherein the application module is arranged to create the constraint satisfaction problem of a given step instance based on at least one part in the part-of hierarchy, the interrelated set of parameters for each part defining:

a first number of instances, and a set of descendants thereto, the first number of instances ranging from zero and up, and the set of descendants ranging from empty to a predefined maximum for the part.

3. The system according to claim 2, wherein the part-of hierarchy is organized as a number of nodes, each node being associated with at least one selectable part, the nodes being organized as ascending parts and descending parts such that each ascending part is positioned at a higher hierarchal level than any descending parts associated with the ascending part.

4. The system according to claim 1, wherein the application module is arranged to:

cause presentation of a selectable range of alternatives for at least one part in the part-of hierarchy, the selectable range of alternatives being defined by a class specifying a group of components, and receive input data in the form of a type variable designating a selected component, each component in the class being associated with a constraint tying the type variable to at least one feature of the artifact.

5. The system according to claim 1, comprising an input interface arranged to:

receive the input data in respect of each step instance in said sequence of step instances, and receive a user-generated proceed command arranged to cause the application module to proceed to a subsequent step instance in said sequence of step instances.

6. The system according to claim 5, comprising an output interface arranged to:

receive at least one resulting variable value from each step instance in said sequence of step instances, the least one resulting variable value being a calculation result delivered by the application module, and present the calculation result on a user-comprehensible format.

7. The system according to claim 6, wherein for all non-first step instances the application module is arranged to:

receive a user-generated backing command, the backing command designating returning to a step instance preceding a currently executed step instance in said sequence of step instances, and in response to a received backing command store variable values produced in the currently executed step instance, cause presentation of the range of variables whose values are selectable in the preceding step instance, order the processing means to solve the constraint satisfaction problem of the preceding step instance based on:

variables values set in response to user-generated input data, and any variable values determined in one or more step instances preceding the preceding step instance, receive a set of resulting variable values from the processing means, and cause presentation of the set of resulting variable values.

8. The system according to claim 7, wherein the processing means after presentation of the set of resulting variable values and in response to the user-generated proceed command is arranged to solve the constraint satisfaction problem of this step instance such that a largest possible number of the stored variable values are restored.

9. The system according to claim 1, wherein the processing means is arranged to implement the application module.

10. A method of configuring an artifact whose constituting components and features are selectable via parameters in an interrelated set of parameters, a range of consistent configurations for the artifact being defined by a set of constraints restricting which variable values that are simultaneously selectable, the method comprising:

storing a problem description in the form of a part-of hierarchy, storing a list of step definitions, the part-of hierarchy including at least two different parts and each step definition including a pointer to a respective part in the part-of hierarchy, creating step instances which are based on the list of step definitions, executing the step instances sequentially, the execution of each step instance involving:

creating a constraint satisfaction problem based on the part to which the pointer of a corresponding step definition points and any descendents to this part, presenting a range of variables wherein each variable has at least one selectable value assignable via the parameter settings in the input data, and in response to selected variable values solving the constraint satisfaction problem of the step instance based on the selected variable values and any variable values resulting from any preceding step instances of said sequence, and presenting the set of resulting variable values, and prompting repeatedly a user to enter input data until all the step instances in said sequence of step instances have been executed.

11. The method according to claim 10, comprising creating the constraint satisfaction problem of a given step instance based on at least one part in the part-of hierarchy, the interrelated set of parameters for each part defining:

a first number of instances, and a set of descendants thereto, the first number of instances ranging from zero and up, and the set of descendants ranging from empty to a predefined maximum for the part.

12. The method according to claim 11, comprising organizing the part-of hierarchy as a number of nodes, each node being associated with at least one selectable part, the nodes being organized as ascending parts and descending parts such that each ascending part is positioned at a higher hierarchal level than any descending parts associated with the ascending part.

13. The method according to claim 10, comprising:
presenting of a selectable range of alternatives for at least one part in the part-of hierarchy, the selectable range of alternatives being defined by a class specifying a group of components, and
receiving input data in the form of a type variable designating a selected component, each component in the class being associated with a constraint tying the type variable to at least one feature of the artifact.

14. The method according to claim 10, comprising:
receiving the input data in respect of each step instance in said sequence of step instances, and
receiving a user-generated proceed command arranged to cause the application module to proceed to a subsequent step instance in said sequence of step instances.

15. The method according to claim 14, comprising:
receiving at least one resulting variable value from each step instance in said sequence of step instances, the least one resulting variable value being a calculation result delivered by the application module, and
presenting the calculation result on a user-comprehensible format.

16. The method according to claim 15, wherein for all non-first step instances the method comprising:
receiving a user-generated backing command, the backing command designating returning to a step instance preceding a currently executed step instance in said sequence of step instances, and in response to a received backing command
storing variable values produced in the currently executed step instance,
presenting the range of variables whose values are selectable in the preceding step instance,
solving the constraint satisfaction problem of the preceding step instance based on:
variables values set in response to user-generated input data, and
any variable values determined in one or more step instances preceding the preceding step instance,
receiving a set of resulting variable values from the processing means, and
presenting the set of resulting variable values.

17. The method according to claim 16, wherein the method after presentation of the set of resulting variable values and in response to the user-generated proceed command comprising solving the constraint satisfaction problem of this step instance such that a largest possible number of the stored variable values are restored.

18. A computer program product for configuring an artifact whose constituting components and features are selectable via parameters in an interrelated set of parameters, a range of consistent configurations for the artifact being defined by a set of constraints restricting which variable values that are simultaneously selectable, the computer program product comprising at least one computer-readable storage medium having computer-executable program code instructions stored therein, the computer-executable program code instruction comprising program code instructions for:
storing a problem description in the form of a part-of hierarchy,
storing a list of step definitions,
the part-of hierarchy including at least two different parts and each step definition including a pointer to a respective part in the part-of hierarchy,
creating step instances which are based on the list of step definitions,
executing the step instances sequentially, the execution of each step instance involving:
creating a constraint satisfaction problem based on the part to which the pointer of a corresponding step definition points and any descendents to this part,
presenting a range of variables wherein each variable has at least one selectable value assignable via the parameter settings in the input data, and in response to selected variable values
solving the constraint satisfaction problem of the step instance based on the selected variable values and any variable values resulting from any preceding step instances of said sequence, and
presenting the set of resulting variable values, and
prompting repeatedly a user to enter input data until all the step instances in said sequence of step instances have been executed.

19. The computer program product according to claim 18, comprising program code instructions for creating the constraint satisfaction problem of a given step instance based on at least one part in the part-of hierarchy, the interrelated set of parameters for each part defining:
a first number of instances, and
a set of descendants thereto,
the first number of instances ranging from zero and up, and the set of descendants ranging from empty to a predefined maximum for the part.

20. The computer program product according to claim 19, comprising program code instructions for organizing the part-of hierarchy as a number of nodes, each node being associated with at least one selectable part, the nodes being organized as ascending parts and descending parts such that each ascending part is positioned at a higher hierarchal level than any descending parts associated with the ascending part.

21. The computer program product according to claim 18, comprising program code instructions for:
presenting of a selectable range of alternatives for at least one part in the part-of hierarchy, the selectable range of alternatives being defined by a class specifying a group of components, and
receiving input data in the form of a type variable designating a selected component, each component in the class being associated with a constraint tying the type variable to at least one feature of the artifact.

22. The computer program product according to claim 18, comprising program code instructions for:
receiving the input data in respect of each step instance in said sequence of step instances, and
receiving a user-generated proceed command arranged to cause the application module to proceed to a subsequent step instance in said sequence of step instances.

23. The computer program product according to claim 22, comprising program code instructions for:
receiving at least one resulting variable value from each step instance in said sequence of step instances, the least one resulting variable value being a calculation result delivered by the application module, and
presenting the calculation result on a user-comprehensible format.

24. The computer program product according to claim 23, wherein for all non-first step instances the computer program product comprising program code instructions for:
receiving a user-generated backing command, the backing command designating returning to a step instance preceding a currently executed step instance in said sequence of step instances, and in response to a received backing command storing variable values produced in the currently executed step instance, presenting the range of variables whose values are selectable in the preceding step instance, solving the constraint satisfaction problem of the preceding step instance based on:
- variables values set in response to user-generated input data, and
- any variable values determined in one or more step instances preceding the preceding step instance, receiving a set of resulting variable values from the processing means, and presenting the set of resulting variable values.

25. The computer program product according to claim 24, wherein after presentation of the set of resulting variable values and in response to the user-generated proceed command the computer program product further comprises program code instructions for solving the constraint satisfaction problem of this step instance such that a largest possible number of the stored variable values are restored.

* * * * *

UNITED STATES PATENT AND TRADEMARK OFFICE
CERTIFICATE OF CORRECTION

| | | |
|---|---|---|
| PATENT NO. | : 8,078,562 B2 | Page 1 of 1 |
| APPLICATION NO. | : 12/273954 | |
| DATED | : December 13, 2011 | |
| INVENTOR(S) | : Axling | |

It is certified that error appears in the above-identified patent and that said Letters Patent is hereby corrected as shown below:

Column 7

Line 32, "first step instance S1 this," should read -- first step instance S1. In this --

Signed and Sealed this
Twentieth Day of March, 2012

David J. Kappos
*Director of the United States Patent and Trademark Office*